United States Patent
Nakamura et al.

[11] Patent Number: 5,872,079
[45] Date of Patent: Feb. 16, 1999

[54] SUPERCONDUCTOR AND PRECURSOR THEREFOR, THEIR PREPARATION AND USE OF SUPERCONDUCTOR

[75] Inventors: Masaru Nakamura, Tokyo; Yasuji Yamada, Nagoya; Jian-Guo Wen, Tokyo; Yuh Shiohara, Tokyo; Shoji Tanaka, Tokyo, all of Japan

[73] Assignees: Mitsubishi Cable Industries, Ltd.,, Hyogo; International Superconductivity Technology Center, Tokyo, both of Japan

[21] Appl. No.: 762,211

[22] Filed: Dec. 6, 1996

[30] Foreign Application Priority Data

Dec. 8, 1995 [JP] Japan .................................. 7-320901

[51] Int. Cl.$^6$ ........................... H01B 12/00; C04B 35/50; C04B 35/622
[52] U.S. Cl. ......................... 505/126; 505/150; 505/500; 505/780; 505/819
[58] Field of Search ................. 505/125, 126, 505/780, 779, 150, 220, 482, 500, 742, 879; 252/521.1

[56] References Cited

U.S. PATENT DOCUMENTS

| | | | |
|---|---|---|---|
| 5,462,917 | 10/1995 | Salama et al. | 505/150 |
| 5,508,253 | 4/1996 | Morita et al. | 505/126 |
| 5,525,584 | 6/1996 | Murakami et al. | 505/450 |
| 5,648,319 | 7/1997 | Morita et al. | 505/230 |

OTHER PUBLICATIONS

Nakamura et al., "Heat Treatment and Anomalous peak effect in J.H. curve at 77K for $NdBa_2Cu_3O_{1-\delta}$ single–crystal superconductor", Physica C259(1996)295–303 (Abstract) (No Month).

Nakamura et al., "Fabrication of $NdBa_2Cu_3O_{1-\delta}$ single crystals by the top–seeded solution–growth method in 1%, 21% and 100% oxygen partial pressure atmosphere", Physica C260(1996), 297–304 (Abstract)(No Month).

Primary Examiner—Mark Kopec
Attorney, Agent, or Firm—Wenderoth, Lind & Ponack

[57] ABSTRACT

A superconductor comprising a compound of the formula (II):

$$R_{1+x}Ba_{2-x}Cu_3O_{7-y1} \qquad (II)$$

wherein not less than 40% of a crystal of the superconductor shows phase separation, and at (temperature, magnetic field) of (77[K], O[T]) and (77[K], 4[T]), a critical current density is not less than 10,000 A/cm$^2$, which is obtained by heating a precursor which is a solid solution of the formula (I):

$$R_{1+x}Ba_{2-x}Cu_3O_{7-y} \qquad (I)$$

wherein not more than 10% of a crystal of the solid solution shows phase separation, so that phase separation is formed in the crystals at a phase separation temperature, and introducing oxygen; and a superconductor comprising a compound of the formula (II):

$$R_{1+x}Ba_{2-x}Cu_3O_{7-y1} \qquad (II)$$

wherein not more than 10% of a crystal of the superconductor shows phase separation, and in a magnetic field of not less than 1[T] at a constant temperature of 77[K], a critical current density is less than 10,000 A/cm$^2$, which is obtained by introducing oxygen into the precursor (I) at a temperature less than the lower limit of the phase separation temperature. According to the method of the present invention, a superconductor having a high Jc or having different properties with respect to Jc, which is unobtainable by the conventional production method, can be obtained using the conventional materials.

12 Claims, 19 Drawing Sheets

F I G. 2
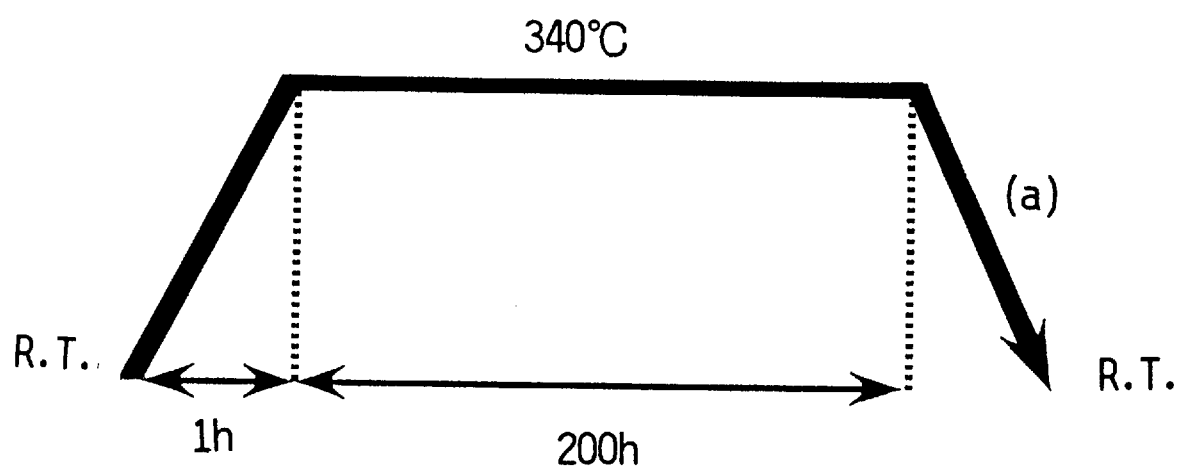

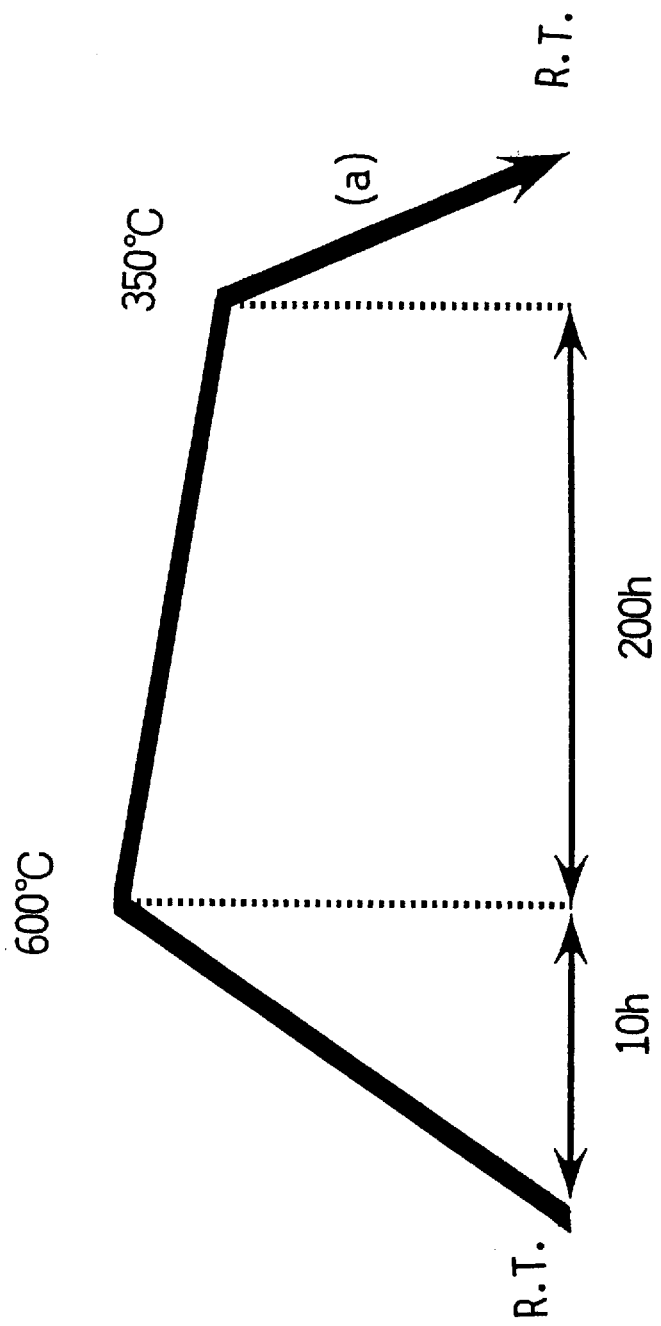

F I G. 9 (a)
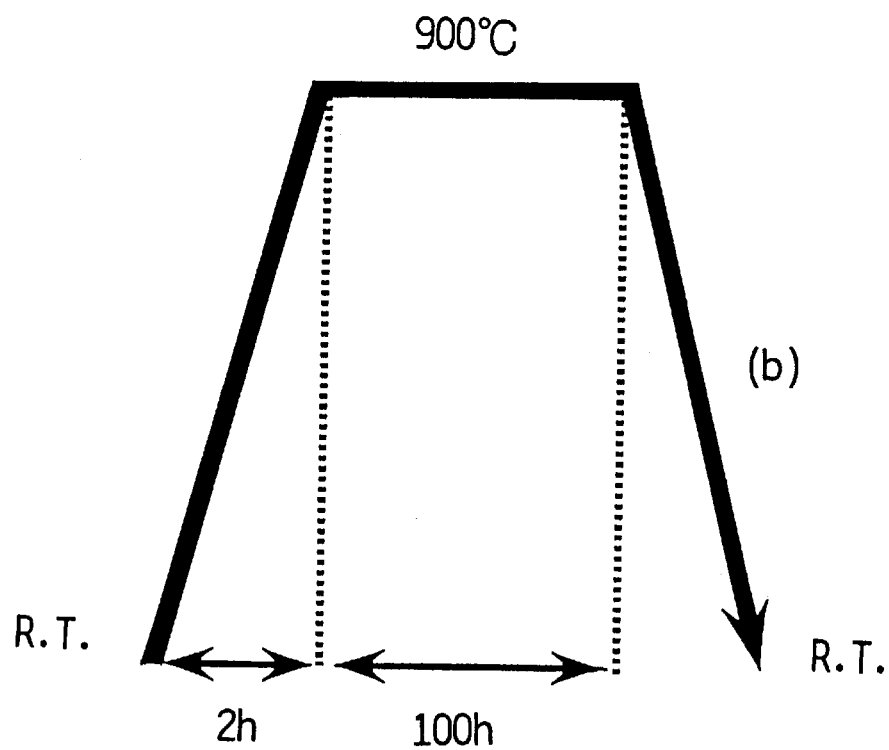
F I G. 9 (b)
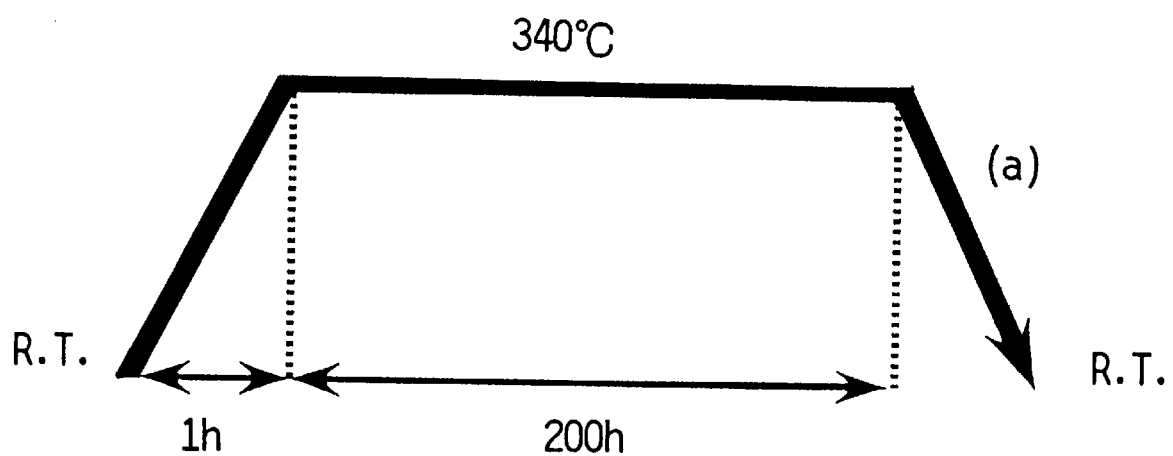

First heat treatment

Second heat treatment

First heat treatment

Second heat treatment

First heat treatment

Second heat treatment

SUPERCONDUCTOR AND PRECURSOR THEREFOR, THEIR PREPARATION AND USE OF SUPERCONDUCTOR

TECHNICAL FIELD OF THE INVENTION

The present invention relates to a superconductor. More particularly, the present invention relates to a superconductor, a precursor therefor, their preparation and use of a superconductor.

BACKGROUND OF THE INVENTION

An oxide superconductor is a high temperature superconductor having a critical temperature (Tc) exceeding 23[K] (Tc) of a conventional superconductor $Nb_3Ge$. Particularly, a superconductor (R123 superconductor) of the formula $RBa_2Cu_3O_{7-c}$ wherein R is a rare earth element including Y and lanthanoid, and $0 \leq c \leq 1$ has a Tc reaching as high as 90[K].

An R123 superconductor is prepared by, for example, a melting method. Taking Y123 ($YBa_2Cu_3O_{7-c}$) for example, a starting material is heated to once give a semi-melt of $Y_2BaCuO_5$ (Y211) phase and a liquid phase, and cooled to a crystallization temperature to give Y123 crystals.

Of the R123 superconductors formed by the melting method, Y123 has been known to have a higher critical current density (Jc).

Conventionally, for the preparation of an R123 (particularly Y123) superconductor having a high Jc by the above-mentioned melting method, the Jc of Y123 is increased by microdispersion of a non-superconductive phase $Y_2BaCuO_5$ (Y211) in the superconductive phase Y123 during the crystal growth thereof. In this case, the Y211 phase is considered to act as a pinning center. Then, the obtained crystals are heat treated (introduction of oxygen) to cause transition of the crystal structure of Y123 from tetragonal one to rhombic one to give a superconductor.

According to the above-mentioned melting method, charging composition (ratio of constitutive elements of the starting material), kind and amount of additives such as Pt, crystal growth temperature and the like are adjusted to control the amount and size of the Y211 phase to be dispersed during the crystal growth of the Y123.

Of the R123 superconductors prepared by the conventional melting method, Y123 alone substantially has a high Tc and a high Jc.

Experimental reports have documented in recent years that an R123 wherein R is an element other than Y was prepared by the melting method while controlling oxygen partial pressure. Yet, the Jc peak of the obtained superconductor was in about 1[T], and a superconductor having a Jc peak in a higher magnetic field has not been produced.

The one obtained by microdispersion of a non-superconductive phase in a superconductive phase during the crystal growth like the above-mentioned mentioned Y123 has a pinning center like Y211 phase, which pinning center having a size of a micron order, so that it cannot increase Jc in the local magnetic field but monotonously reduces Jc with increasing magnetic fields.

Thus, an object of the present invention is to provide a superconductor and a precursor therefor which cannot be obtained by a conventional production method, said superconductor having a high Jc or having different properties with respect to Jc, by the use of the same conventional materials.

Another object of the present invention is to provide use of the superconductor of the present invention.

A still another object of the present invention is to provide the production method of the above-mentioned superconductor and a precursor therefor.

SUMMARY OF THE INVENTION

According to the present invention, it has been found that the R123 superconductors show a phase separation, and by controlling said phase separation, a superconductor having properties conventionally unachieved can be obtained. It has been further found that the above-mentioned phase separation can be easily controlled by applying a heat treatment to a precursor based on the upper and lower limits of the phase separation temperature of the precursor which is obtained by rapidly cooling solid solution crystals after crystal growth, so that reactions which occur during the cooling can be inhibited.

Thus, the present invention provides a precursor comprising a solid solution of the formula (I):

$$R_{1+x}Ba_{2-x}Cu_3O_{7-y} \qquad (I)$$

wherein R is a rare earth element, $0 \leq x \leq 1$ and $-1 < y \leq 1$, in which not more than 10% of a crystal of the solid solution shows phase separation.

The above superconductor precursor can be obtained by heating the crystals of the compound of the formula (I):

$$R_{1+x}Ba_{2-x}Cu_3O_{7-y} \qquad (I)$$

wherein each symbol is as defined above, to a temperature (t, °C.) exceeding the upper limit (ta, °C.) of phase separation temperature of the precursor, i.e. ta<t, and rapidly cooling the crystals.

The superconductor of the present invention prepared from the above precursor is largely divided into the following two types (A) and (B) having different properties.

(A) A superconductor comprising a compound of the formula (II):

$$R_{1+x}Ba_{2-x}Cu_3O_{7-y1} \qquad (II)$$

wherein R is a rare earth element, $0 \leq x \leq 1$ and $-1 \leq y1 < 1$, in which not less than 40% of a crystal of the superconductor shows phase separation and at (temperature, magnetic field) of (77[K], 0[T]), a critical current density is not less than 10,000 A/cm$^2$.

This type of superconductor (A) can be obtained by heat treating the above precursor at a temperature satisfying the formula $tb \leq t \leq ta$ wherein ta is the upper limit of phase separation temperature (°C) of the precursor and tb is the lower limit of phase separation temperature (°C) of the precursor, namely, the phase separation temperature of the precursor to cause phase separation in the crystals, and introduction of oxygen.

(B) A superconductor comprising a compound of the formula (II):

$$R_{1+x}Ba_{2-x}Cu_3O_{7-y1} \qquad (II)$$

wherein R is a rare earth element, $0 \leq x \leq 1$ and $-1 \leq y1 < 1$, in which not more than 10% of a crystal of the superconductor shows phase separation and a critical current density is less than 10,000 A/cm$^2$ at a magnetic field of not less than 1[T] at a constant temperature of 77[K].

This type of superconductor (B) can be prepared by introducing oxygen into the above-mentioned precursor by heating the precursor at a temperature of less than tb without a phase separation formed in the crystals.

BRIEF EXPLANATION OF DRAWINGS

FIG. 2 is a graph schematically showing the relationship between the temperature and time of the heat treatment applied to the precursor in Example 2.

FIGS. 9(a) and 9(b) are graphs schematically showing the relationship between the temperature and time of the heat treatment applied to the precursor in Example 5.

DETAILED DESCRIPTION OF THE INVENTION

Figure 1:
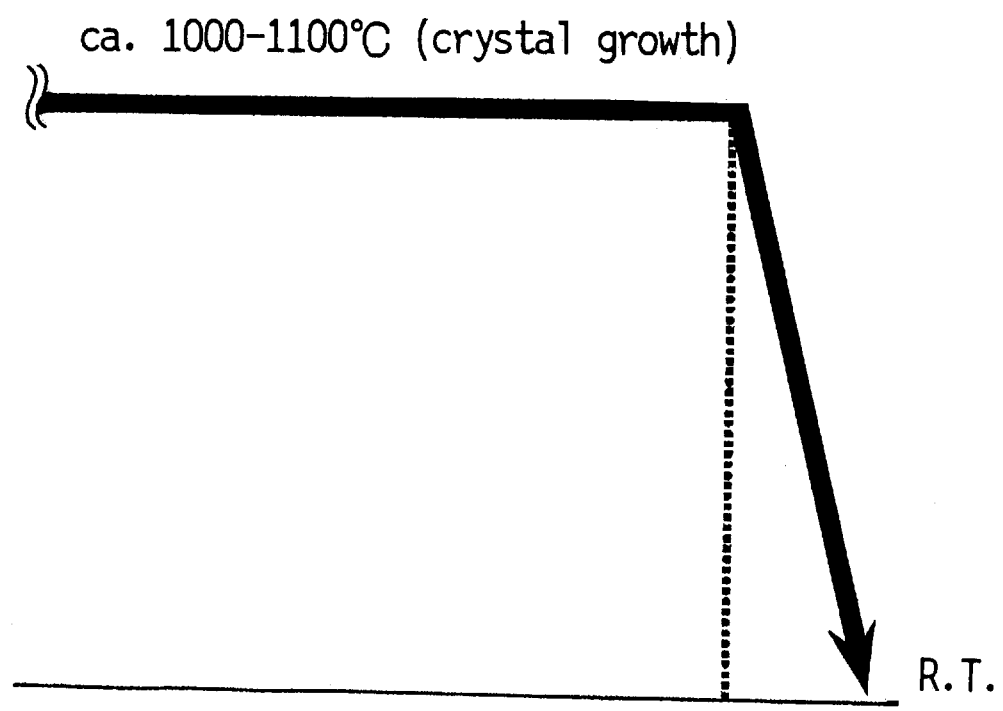
FIG. 1 is a graph schematically showing the relationship between the temperature and time of the heat treatment for forming a precursor in Example 1.

As used herein, the phase separation temperature is a temperature in a certain range found by the present inventors, in which crystals can form a separate phase, and in which a solid reaction of constitutive elements except oxygen can take place. This range is specific to the kind of R and the composition ratio of the formula (I).

As used herein, the term "phase separation" means that a crystal includes plural phases which are different from each other in composition ratios, and therefore, crystal structures. The composition ratio of the crystal as a whole is the same as that when the crystal have a single phase. The phase separation of R123 crystals has been first noted by the present inventors.

For example, $Nd_{1+x}Ba_{2-x}Cu_3O_{7-y}$ (Nd123) partially has two separate crystal structures represented by the formulas: $Nd_{1+z}Ba_{2-z}Cu_3O_{7-m}$ and $Nd_{1+w}Ba_{2-w}Cu_3O_{7-n}$ wherein $0 \leq z \leq 1$, $0 \leq w \leq 1$, $-1 \leq m \leq 1$ and $-1 \leq n \leq 1$ provided $z \neq w$ and $m \neq n$, thus showing separation into two phases. Such phase separation can be observed with an electron microscope. The composition ratio as a whole is the same as that when the crystals have a single phase.

The R123 crystals show a single phase at a temperature (t) which is higher than ta (ta<). By a single phase of the R123 crystals is meant that the crystals may include those having phase separation in a proportion of not more than 10% thereof. At $tb \leq t \leq ta$, the R123 material can cause a solid reaction, as a result of which crystals show phase separation. At a temperature less than tb, a solid reaction cannot substantially occur because of the low temperature, and the crystal structure exclusive of oxygen, which has been formed by the previous heat history, is substantially maintained in this temperature range.

The present invention is significantly characterized by the use of an intermediate substance, i.e., the above-mentioned precursor, having a single phase crystal structure which may include crystals having phase separation in a proporation of not more than 10% of the crystal, during the process for forming the objective superconductor from the starting material.

The crystals may have any temperature above or below the phase separation temperature found by the present inventors. Crystals having a temperature higher than the upper limit of the phase separation temperature may not have ever reached, from the temperature of the crystal growth, a temperature not more than the upper limit of the phase separation temperature. On the other hand, the crystals having a temperature not more than the lower limit of the phase separation temperature essentially requires application of the production method of the present invention in order to obtain the precursor, which can be obtained by rapidly cooling the crystals from a temperature beyond the upper limit of the phase separation temperature to a temperature below the lower limit thereof.

By the application, to such precursor, of the heat treatment well controlled with respect to the phase separation temperature, a superconductor can be obtained which has superior properties heretofore not accomplished by the prior art.

The precursor for the superconductor of the present invention (hereinafter also referred to simply as a precursor) can be obtained by heating the crystals composed of the compound of the formula (I):

$$R_{1+x}Ba_{2-x}Cu_3O_{7-y} \tag{I}$$

wherein each symbol is as defined above to a temperature (t, °C.) beyond the upper limit (ta, °C.) of the phase separation temperature, and then rapidly cooling the same.

While there are various methods for forming the crystals, the crystals can be obtained by, for example, traveling-solvent floating zone method, top-seeded solution-growth method, slow cooling method, and the like, from a compound or a mixture of compounds comprising elements constituting the objective precursor, namely, R (rare earth element), Ba and Cu.

A starting compound comprising R (rare earth element), Ba, Cu and O is exemplified by metal oxides such as $Na_2O_3$, BaO, $BaCO_3$, CuO, $BaCuO_2$ and the like.

The starting material for the precursor may be any that is obtained without sufficient introduction of oxygen or may be a superconductor, as long as it has the required R123 component ratio as a whole.

The starting material used for forming a precursor is not limited with respect to its preparation method and heat history, and may be one formed by a vapor phase method inclusive of various film forming methods such as sputtering, liquid phase method inclusive of melting method, solid phase method inclusive of sintering, or other known synthetic method. The state of the crystals is not questioned as long as the component ratio is met as a whole, as mentioned above.

The crystals are heated to a temperature t satisfying ta<t and rapidly cooled, whereby a precursor can be obtained at a temperature as low as room temperature.

Taking Nd123 as a representative R123, ta of Nd123 precursor varies depending on the value of x of the formula (I). For example, when x=0, it exists between 500° C. and 600° C. as in Example 6. Similarly, tb exists between 400° C. and 500° C. when x=0 as in Example 6. The accurate ta and tb values which vary depending on the composition ratio x can be obtained between 500° C. and 600° C., and 400° C. and 500° C., respectively, by the try-and-error method upon subdivision of sampling intervals at respective testing temperatures.

The temperature for heating precursor (heating temperature before rapid cooling) may be any as long as it exceeds ta, and up to the decomposition temperature of the crystals. For example, when x=0, desirable results are obtained when the temperature is higher than ta by not less than about 600° C., particularly not less than about 900° C. Such preferable temperature varies depending on the starting material.

The temperature after rapid cooling is less than tb. The range of temperature fall from tb also differs depending on the material. For example, when x=0, desirable results are obtained when the temperature is not lower than about 400° C. The temperature after rapid cooling can be appropriately adjusted to, for example, room temperature, according to the heat treatment in the subsequent steps.

As used herein, "rapid cooling" means that the crystals pass through the phase separation temperature range from a temperature exceeding ta (temperature before rapid cooling) preferably to a temperature less than tb (temperature after rapid cooling) at a falling rate that causes no phase separation in the crystals. That is, since a moderate temperature fall during cooling, i.e., during passage through the phase separation temperature range, causes solid reaction in the crystals to result in phase separation, the crystals are cooled at a temperature fall rate that does not cause phase separation.

While the upper limit of the temperature fall rate may be such a steep one as applied in the case of annealing of steel, it is generally a rate that does not cause cracking of the crystals due to a thermal impact.

The method for rapid cooling includes leaving the crystals in a room directly from a furnace, immersing the crystals in a cool medium for rapid cooling, and the like, which are selected as appropriate according to the shape and weight of the objective product.

The conditions of rapid cooling such as oxygen atmosphere are not critical here. While oxygen may be introduced during the rapid cooling step, a sufficient amount of oxygen is preferably introduced in a later step, so that superior superconductivity can be obtained.

A specific example of the production step of the precursor is a method comprising growing Nd123 crystals with comparatively less substitution of Nd-Ba under a low oxygen partial pressure (e.g., 1% oxygen partial pressure) at a certain temperature (ca. 1020° C.), and rapid cooling. For the rapid cooling after crystal growth, the crystals are taken out as quickly as possible from the crystal growth furnace, so that a gradual cooling time causing phase separation is not applied in the cooling step.

The precursor thus obtained predominantly has a single phase crystal structure. The single phase here means that the area of phase separation in one crystal occupies not more than 10%, preferably not more than 1% of the crystal. Ideally, a complete single phase, i.e., no phase separation, is desirable.

The degree of single phase of the Nd123 precursor crystals, in other words, the proportion of phase separation in one crystal, is measured with, for example, an electron microscope. For example, the precursor is observed with a transmission type electron microscope (TEM). Phase separation shows, on the screen, a stripe pattern wherein separate two phases are alternately arranged in the bands of about 10 nm–100 nm width, or a cross pattern wherein said stripe patterns are assembled in different directions. The observation points (n=20) are randomly determined in a sample, and the proportion of phase separation in one crystal is calculated from the obtained results.

The precursor may be single crystals or polycrystals and may be used in a variety of applications. When a magnet is fabricated using a superconductor having a high Jc, for example, single crystal precursors are more preferable.

The precursor is a solid solution composed of a compound of the formula (I):

$$R_{1+x}Ba_{2-x}Cu_3O_{7-y} \qquad (I)$$

wherein R is a rare earth element, $0 \leq x \leq 1$ and $-1 < y \leq 1$, preferably $0 \leq y \leq 1$, and does not show superconductivity.

R in the formula (I) is a rare earth element, and is exemplified by Y, Sc, lanthanoid and the like. The lanthanoid is a general name designating 15 rare earth elements from atomic No. 57, La to No. 71, Lu.

Of those exemplified as R, La, Ce, Pr, Nd, Pm, Sm, Eu and Gd are preferably used in the present invention, since they easily form a solid solution of R123. Particularly preferred is Nd which has a high Tc as La, easily forms a precursor as a single phase and uniform solid solution, and which easily causes phase separation.

The solid solution may be a mixture of two or more kinds of compounds having different rare earth elements.

In particular, when the solid solution is a mixture of a compound of the formula (I'):

$$R'_{1+x}Ba_{2-x}Cu_3O_{7-y} \qquad (I')$$

wherein R' is a rare earth element of La, Ce, Pr, Nd, Pm, Sm, Eu or Gd, and x and y are as defined above, and a compound of the formula (I"):

$$R''_{1+x}Ba_{2-x}Cu_3O_{7-y} \qquad (I'')$$

wherein R" is a rare earth element selected from lanthanoid and Y, and x and y are as defined above, a superconductor showing high critical current density from a low magnetic field to a high magnetic field can be formed by combining only beneficial points of the critical current density inherent to each element. The thus-obtained precursor is subjected to heat treatment and oxygen introduction, thereby to give superconductors. Depending on the treatment conditions, two kinds of superconductors can be obtained, which show markedly different Jc properties.

One of them is a superconductor having a high Jc (hereinafter to be referred to as a high Jc superconductor) and the other is a superconductor having a low Jc (hereinafter to be referred to as a low Jc superconductor).

A high Jc superconductor is obtained by a treatment in such a way that the phase separation of the crystal is formed while maintaining the precursor at a temperature t which satisfies tb≦t≦ta. That is, the precursor is maintained at a temperature satisfying tb≦t≦ta for a period necessary for forming phase separation. The temperature of the heat treatment which is different from the heat treatment of the present invention and which may be appplied before and after this heat treatment is outside the range of tb≦t≦ta. To avoid elimination of the phase separation in the obtained superconductor, which may bring the superconductor back into a precursor, rapid cooling from a temperature higher than ta is avoided after completion of the phase separation.

The time of heat treatment necessary for forming this phase separation varies depending on the temperature and composition of the sample. It is generally about 10 h–5,000 h, preferably 50 h–500 h, which is mostly the longer the better.

The oxygen introduction necessary for forming a superconductor may be applied during this heat treatment. Alternatively, it may be done later as an independent step. The specific conditions of oxygen introduction are known.

The obtained high Jc superconductor is composed of a compound of the formula (II):

$R_{1+x}Ba_{2-x}Cu_3O_{7-y1}$ (II)

wherein R is a rare earth element, $0 \leq x \leq 1$ and $-1 \leq y1 < 1$, preferably $0 \leq y1 < 1$, and phase separation occurs in not less than 40% of a crystal of the superconductor, and it shows a Jc of not less than 10,000 A/cm² at (temperature, magnetic field) of (77[K], 0[T]) and (77[K], 4[T]).

The superconductor of the formula (II) is obtained by heat treatment of and oxygen introduction into the precursor of the formula (I), so that the explanation for the formula (I) applies to the formula (II). In addition, the relationship between y and y1 of the superconductor (II) $R_{1+x}Ba_{2-x}Cu_3O_{7-y1}$ prepared from the precursor (I) $R_{1+x}Ba_{2-x}Cu_3O_{7-y}$ is y<y1. The superconductor of the mixture of the compounds (II') and (II") having the following formulas can be obtained from the precursor of the mixture of the compounds (I') and (I"):

$R'_{1+x}Ba_{2-x}Cu_3O_{7-y1}$ (II')

$R''_{1+x}Ba_{2-x}Cu_3O_{7-y1}$ (II")

wherein each symbol is as defined above.

In said high Jc superconductor, not less than 40%, preferably not less than 50%, particularly preferably not less than 60% of a crystal shows phase separation. While the upper limit of the proportion of the phase separation is not particularly set, it is preferably 80% and more preferably about 90%.

In the case of said high Jc superconductor, the proportion of the phase separation is set for such a value that affords the highest Jc of the obtained superconductor.

The method for determining the proportion of the phase separation in the crystals may be an observation with an electron microscope as mentioned above in the explanation of the precursor, magnetic measurement by a SQUID (superconducting quantum interference device) magnetometer and the like.

This high Jc superconductor has a critical current density of not less than 10,000 A/cm² at least at (temperature, magnetic field) of (77[K], 0[T]) and (77[K], 4[T]). This is a superconductor having a high Jc that has not been conventionally achieved by this group of materials. The particularly note-worthy property of the high Jc superconductor of the present invention is the Jc peak in the higher ever magnetic field, and a Jc peak in not less than 2[T] at 77[K], in contrast to that in about 1[T] in the conventional superconductors.

Figure 15:
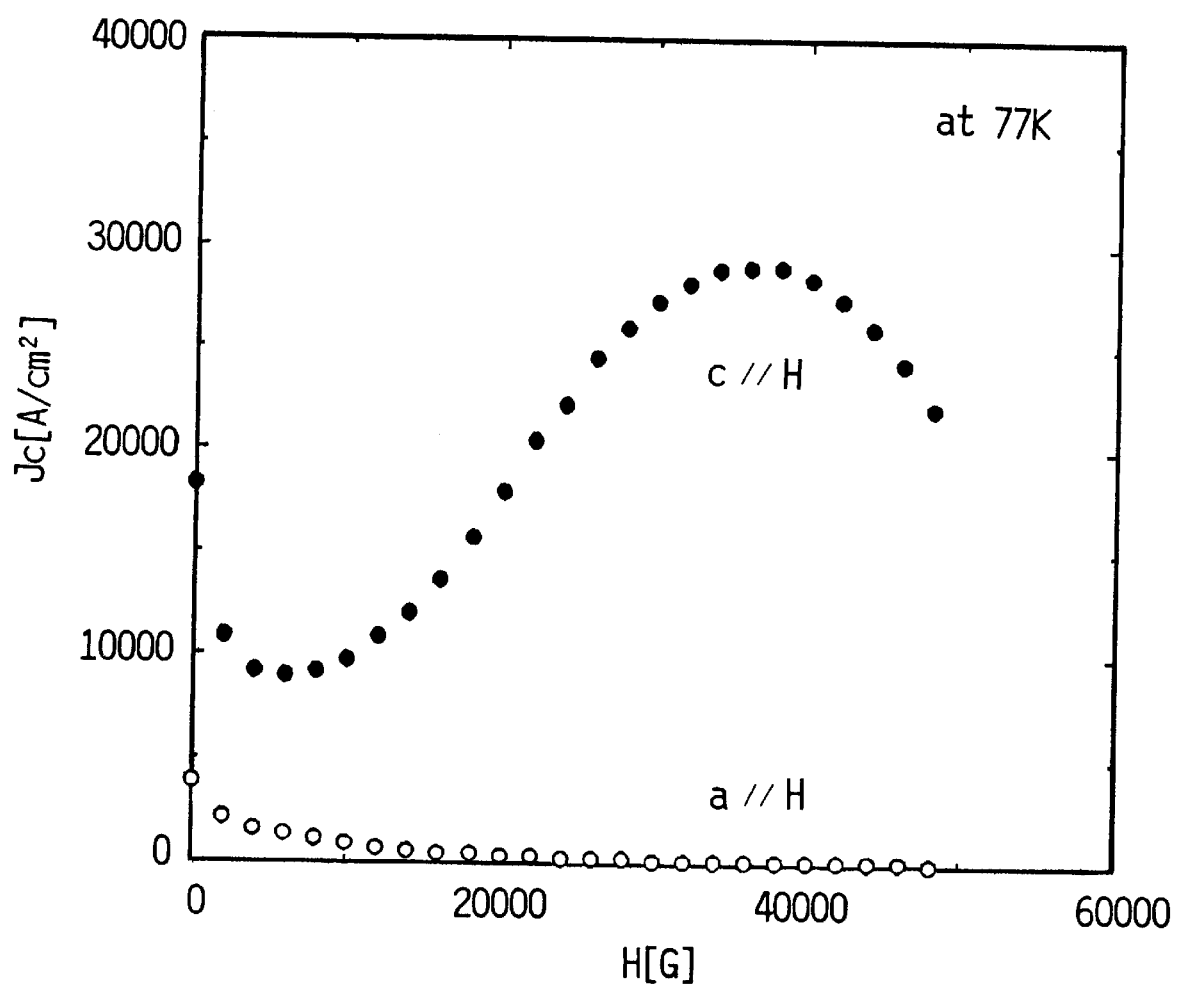
FIG. 15 is a graph showing the critical current density of the superconductor obtained in Example 6 by the heat treatment under the conditions shown in FIG. 12.

For example, an Nd123 superconductor prepared by the method of the present invention shows Jc having a peak of as high as about 30,000 A/cm² in the vicinity of about 4[T] (=ca. 40,000[G]), as shown by the black circle plotting in FIG. 15 which presents the relationship between the strength of the magnetic field and Jc at a constant value of 77[K].

A low Jc superconductor is prepared from the above-mentioned precursor. The precursor undergoes oxygen introduction at a temperature t satisfying t<tb, at which phase separation is not produced in the crystals, whereby a superconductor is obtained.

The temperature t satisfying the above mentioned temperature range t<tb is too low to cause phase separation in the crystals, and oxygen alone is introduced to form a superconductor.

In the case of Nd123, for example, a precursor of a cube of about 2 mm each side may be subjected to a heat treatment at 340° C. for 200 h in an $O_2$ 100% flow supply.

The oxygen introduction to form a superconductor is done during this heat treatment. When desired, oxygen is further introduced in an independent step. Specific conditions of the oxygen introduction are known.

The low Jc superconductor obtained by this heat treatment (inclusive of oxygen introduction) does not newly produce phase separation in the crystals, and the crystal structure is one that comprises phase separation in a proportion of not more than 10% of a crystal, like the above-mentioned precursor.

The phase separation and a method for determining the proportion of the phase separation are as explained with respect to the above-mentioned high Jc superconductor.

A low Jc superconductor has a critical current density of less than 10,000 A/cm² in the magnetic field of not less than 1[T] at a constant temperature of 77[K].

Figure 4:
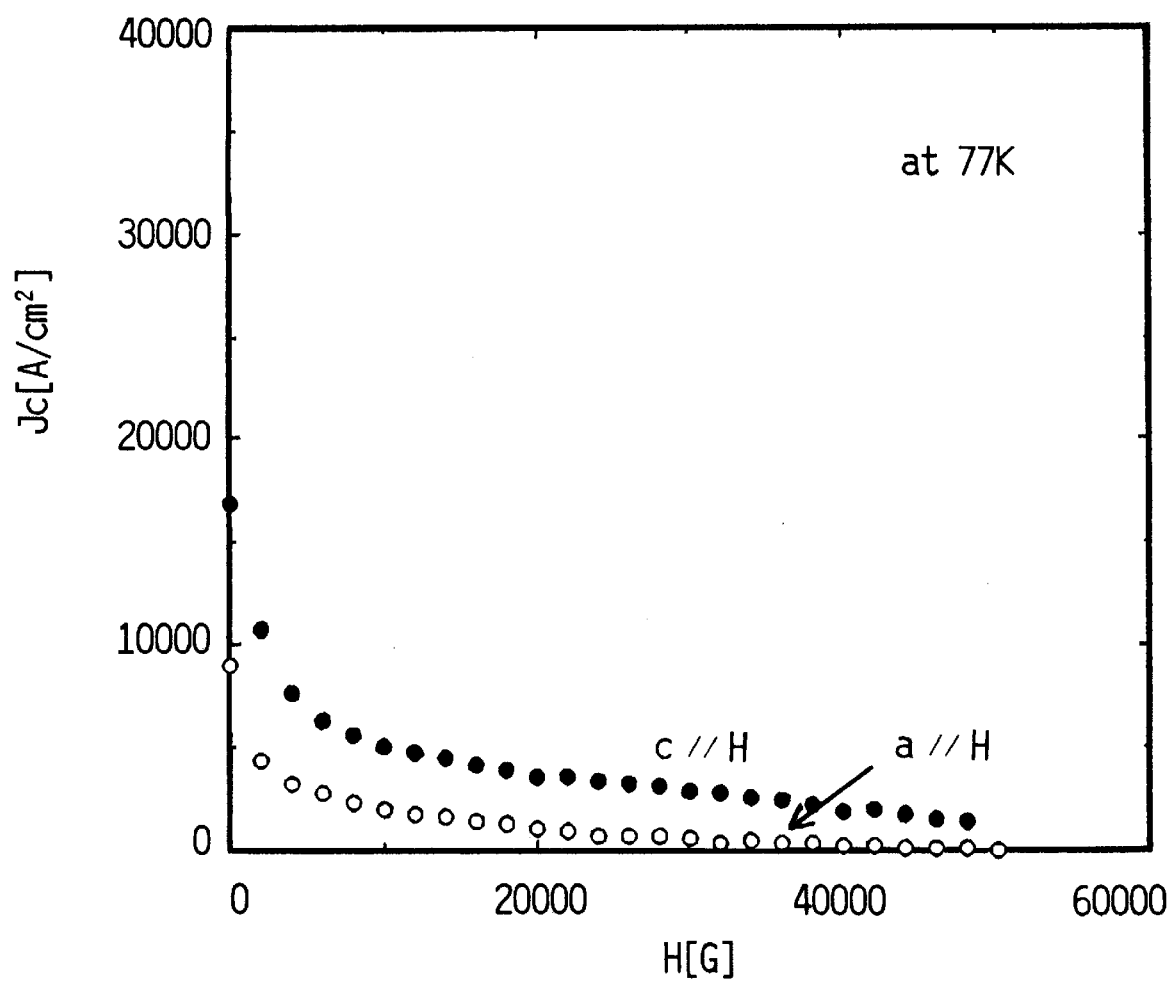
FIG. 4 is a graph showing the critical current density of the superconductor (low Jc superconductor) obtained in Example 2.

Particularly, the relationship between the strength of the magnetic field and Jc in Nd123 at a constant value of 77[K] is new as shown by black circle plotting in FIG. 4, which shows monotonous decrease in Jc from 0[T] to about 5[T].

By the use of the superconductor of the present invention, various superior products can be obtained. By using a high Jc superconductor as a conductor, for example, a magnet having superior magnetic properties such as possible generation of a magnetic field stronger than conventional ones. While the mode of the magnet is not limited, a superconductor coil and a superconductor tape are exemplified.

In addition, by the use of a low Jc superconductor as a conductor, for example, various superconductive elements utilizing the Josephson effects can be formed, which cannot be heretofore formed by conventional techniques with regard to Nd123.

The present invention is described in detail by way of Examples in the following.

EXAMPLE 1

In this Example, a precursor of Nd123 was actually prepared.

The composition of the objective precursor was $Nd_{1.0}Ba_{2.0}Cu_{3.0}O_{6.0}$.

An Nd—Ba—Cu—O solvent was kept at a temperature of 1000°–1100° C. in an $Nd_2O_3$ crucible, and Nd123 crystals were pulled out from the liquid phase, whereby Nd123 crystals were formed. Immediately thereafter, the crystals were rapidly cooled in the air (room temperature) above the liquid surface to give a precursor.

FIG. 1 is a graph schematically showing the changes in temperature which acted on the Nd123 crystals when pulling out the Nd123 crystals from the liquid phase.

The obtained precursor crystals were evaluated with a transmission type electron microscope (TEM). As a result, it was found that the crystals as a whole had a uniform solid solution single phase without phase separation. The determination points were 20 randomly selected sites.

EXAMPLE 2

In the instant Example, a low Jc superconductor was prepared using the precursor prepared in Example 1.

FIG. 2 schematically shows the relationship between the temperature and time during the heat treatment applied to the precursor. As shown in this graph, the precursor was retained at 340° C. which was a temperature less than tb of the precursor for 200 hours under an oxygen atmosphere, and cooled to room temperature (R.T.) in the furnace (a in the graph, cooled in the furnace, hereinafter the same). Oxygen was supplied by flowing under an $O_2$ 100% atmosphere.

By this heat treatment, oxygen was introduced into the precursor without newly forming phase separation in the crystals, and a low Jc superconductor was obtained.

The Tc and Jc at 77[K] of the low Jc superconductor obtained by this Example were determined by a SQUID megnetometer.

Figure 3:
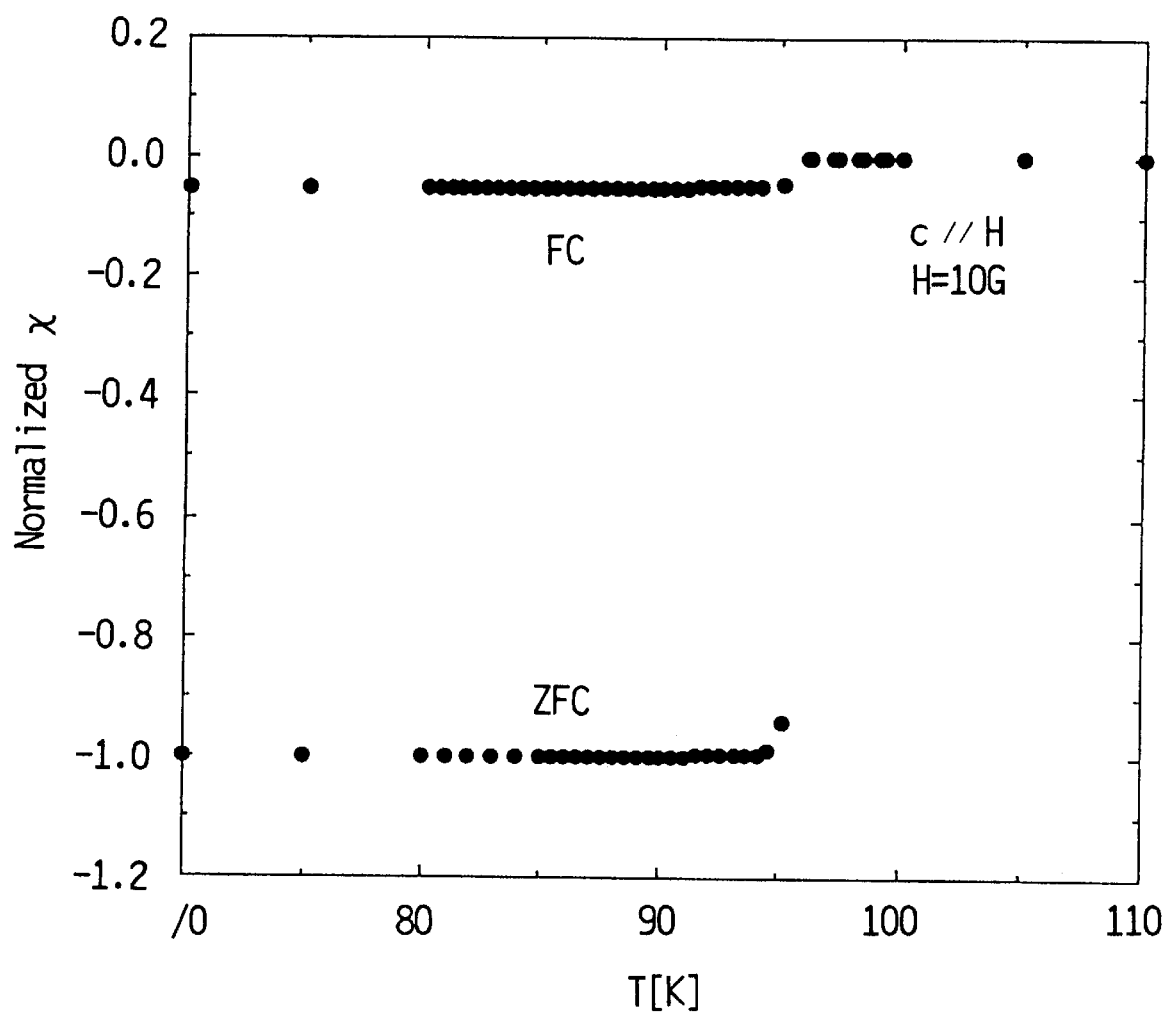
FIG. 3 is a graph showing the critical temperature of the superconductor (low Jc superconductor) obtained in Example 2.

FIG. 3 shows the determined Tc, wherein the determination was run when a magnetic field was activated (FC) during cooling to a superconductor transition temperature, and when it was not activated (ZFC). For determination, a 10[G] magnetic field was activated in parallel to the c axis of the crystals.

As is evident from FIG. 3, superconductor transition occurred at 96.5[K], and the critical temperature (Tc) of the low Jc superconductor obtained by this Example was 96.5 [K].

In FIG. 4, the properties of the low Jc superconductor obtained in this Example, namely, changes in Jc are shown when a magnetic field was acted on from outside. Jc was calculated according to an extended Bean model. The determination was run two ways upon diversion of the direction of the magnetic field to be applied from outside, and the results obtained when a magnetic field was applied in parallel to the a axis of the crystals were plotted with white circles, and the results obtained when a magnetic field was applied in parallel to the c axis of the crystals were plotted with black circles.

As is evident from FIG. 4, the low Jc superconductor of the present invention did not show anisotropy, and even when the direction of the magnetic field to be applied from outside was changed, the Jc showed the same monotonous decrease. When the magnetic field was applied in parallel to either a or c axis of the crystals, it was less than 10,000 $A/cm^2$ at 77[K] at the magnetic field strength of 10,000[G] (=1[T]), thus suggesting monotonous decrease with increasing strengths of the magnetic field. Such property of Jc was void in the Nd123 superconductor prepared by a known melting method.

EXAMPLE 3

In this Example, a high Jc superconductor was prepared using the precursor prepared in Example 1.

Figure 5:
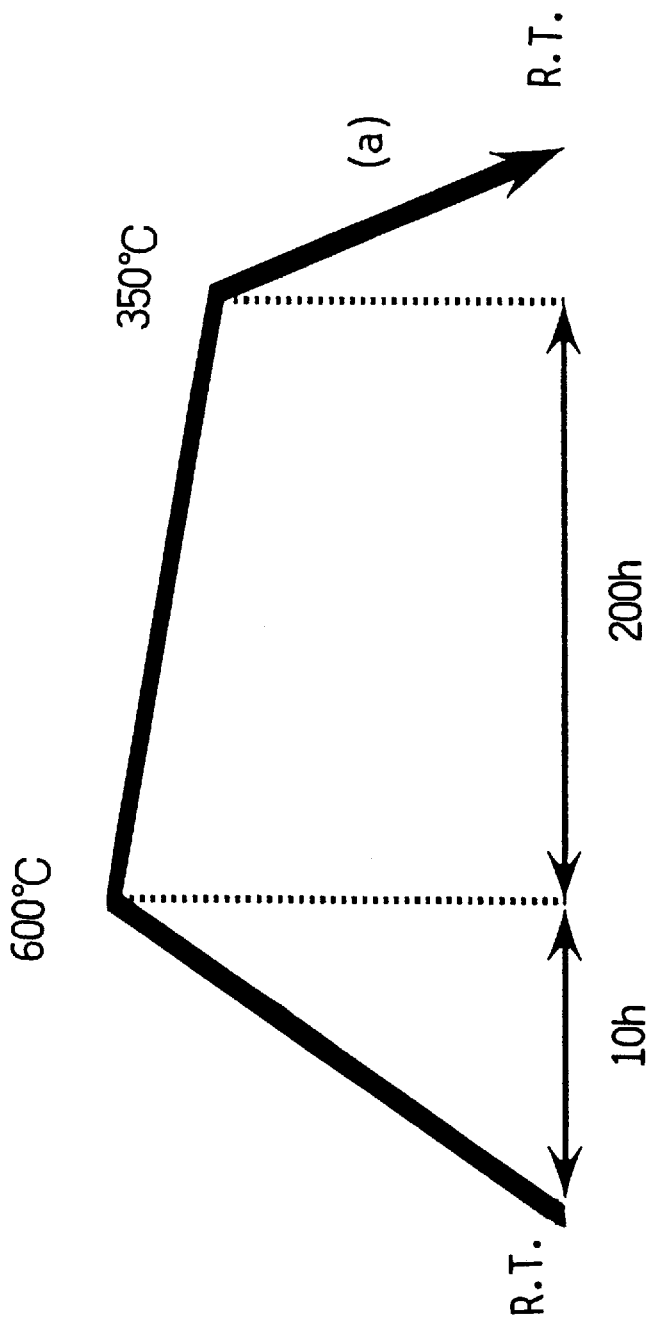
FIG. 5 is a graph schematically showing the relationship between the temperature and time of the heat treatment applied to the precursor in Example 3.

FIG. 5 schematically shows the relationship between the temperature and time during the heat treatment applied to the precursor. As shown in FIG. 5, the precursor was heated to 600° C. which was higher than ta of the precursor under an oxygen atmosphere, and cooled from said temperature to 350° C. which was less than tb over 200 hours, and then to room temperature (R.T.) in the furnace. Oxygen was supplied by flowing under an $O_2$ 100% atmosphere.

This step of gradual cooling from 600° C. to 350° C. included a step (time band) of retaining the sample at a phase separation temperature, which newly forms phase separation in the crystals of the precursor, and a step of oxygen introduction.

The crystals of the obtained sample were evaluated in the same manner as in Example 1 with respect to the precursor. As a result, micro-fine phase separation was confirmed.

Figure 6:
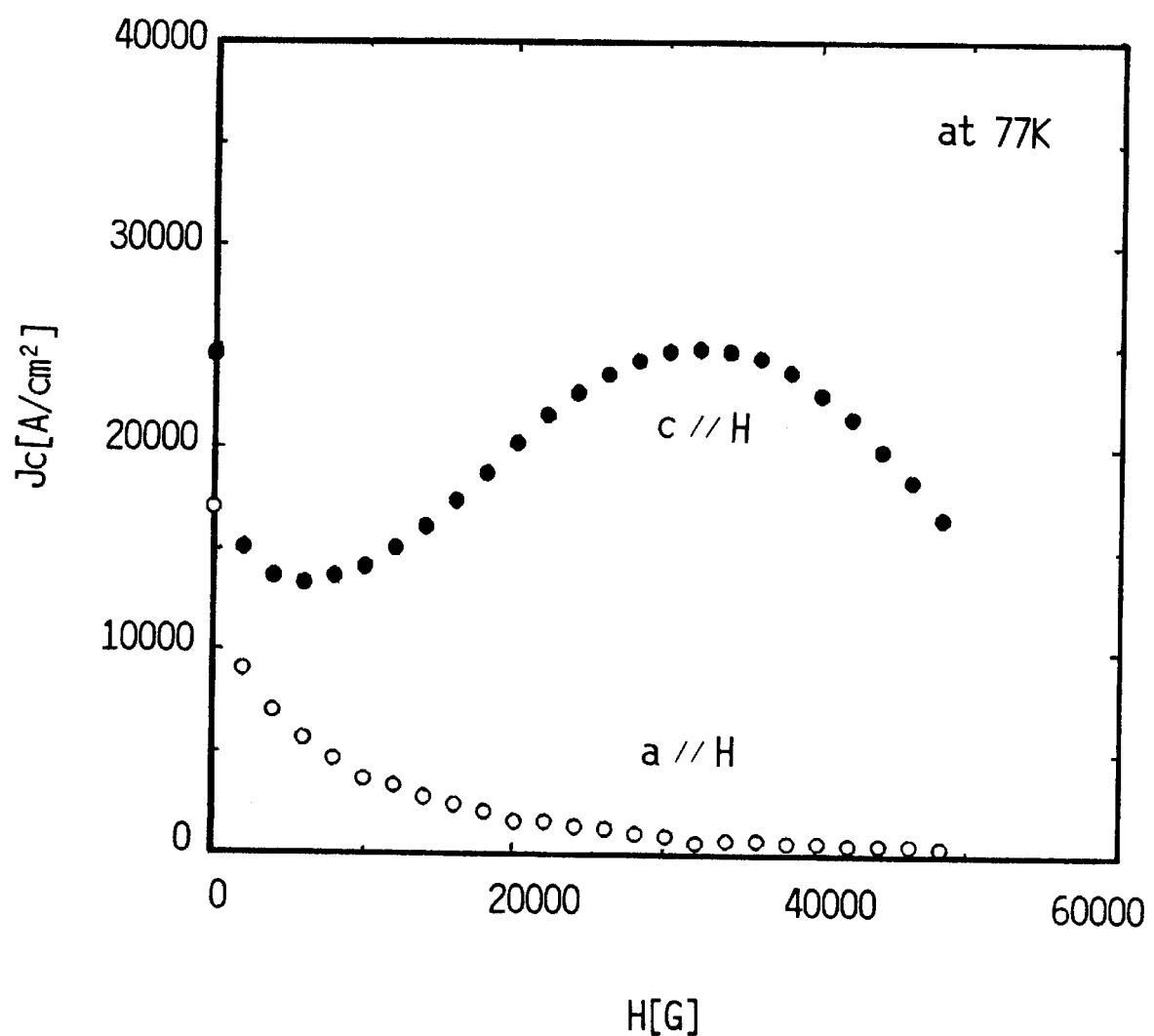
FIG. 6 is a graph showing the critical current density of the superconductor (low Jc superconductor) obtained in Example 3.

FIG. 6 shows the determination of Jc of the high Jc superconductor obtained in this Example. The determination method of Jc and the manner of presentation in a graph were the same as in FIG. 4 relating to Example 2.

As is evident from FIG. 6, the high Jc superconductor obtained in this Example showed anisotropy about the crystal axis, unlike the low Jc superconductor of Example 2, and Jc showed different properties depending on the direction of the magnetic field applied from outside.

Particularly, as is evident from the black circle plotting in FIG. 6, when the magnetic field was applied in parallel to the c axis, Jc became extremely small, about 13000 $A/cm^2$ around a magnetic field of 5000 [G], whereas it showed a highest peak at a high magnetic field side which had not been experienced with this material, and reached 25000 $A/cm^2$ in about 30000 [G].

EXAMPLE 4

In the same manner as in Example 3, a high Jc superconductor was prepared in this Example using the precursor prepared in Example 1, except that an oxygen introduction was additionally performed after the heat treatment.

Figure 7:
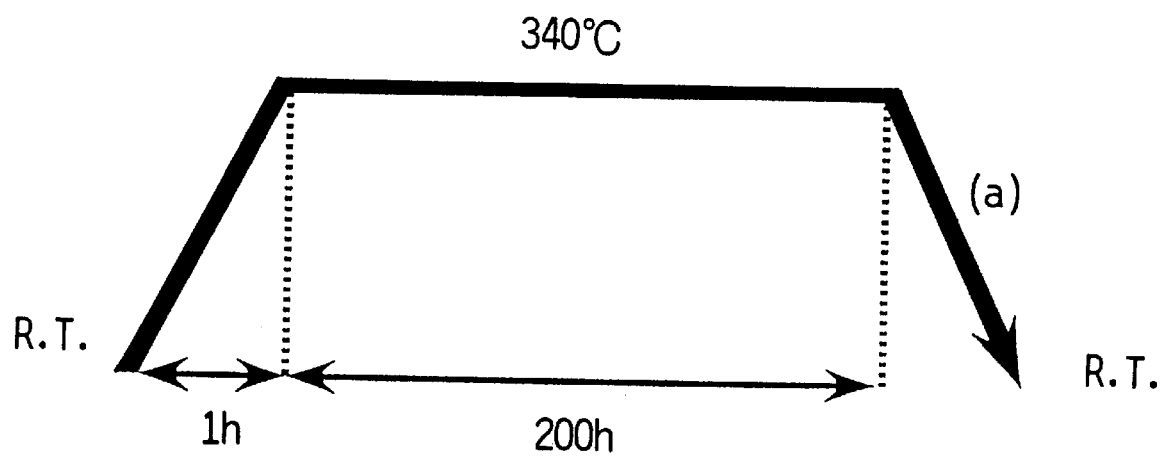
FIGS. 7(a) and 7(b) are graphs schematically showing the relationship between the temperature and time of the heat treatment applied to the precursor in Example 4.

FIGS. 7(a) and (b) schematically show the relationship between the temperature and time during the heat treatment applied to the precursor. The conditions of the heat treatment shown in FIG. 7(a) were the same as those in the heat treatment (FIG. 5) of Example 3, and the conditions of the heat treatment shown in FIG. 7(b) were the same as those in the heat treatment (FIG. 2) of Example 2.

That is, in this Example, the same oxygen introduction as in Example 2 was applied to the high Jc superconductor of Example 3. It was found that the cause of high Jc was not an oxygen deficiency (nonuniform distribution of oxygen concentration) in the Nd123 crystals.

Figure 8:
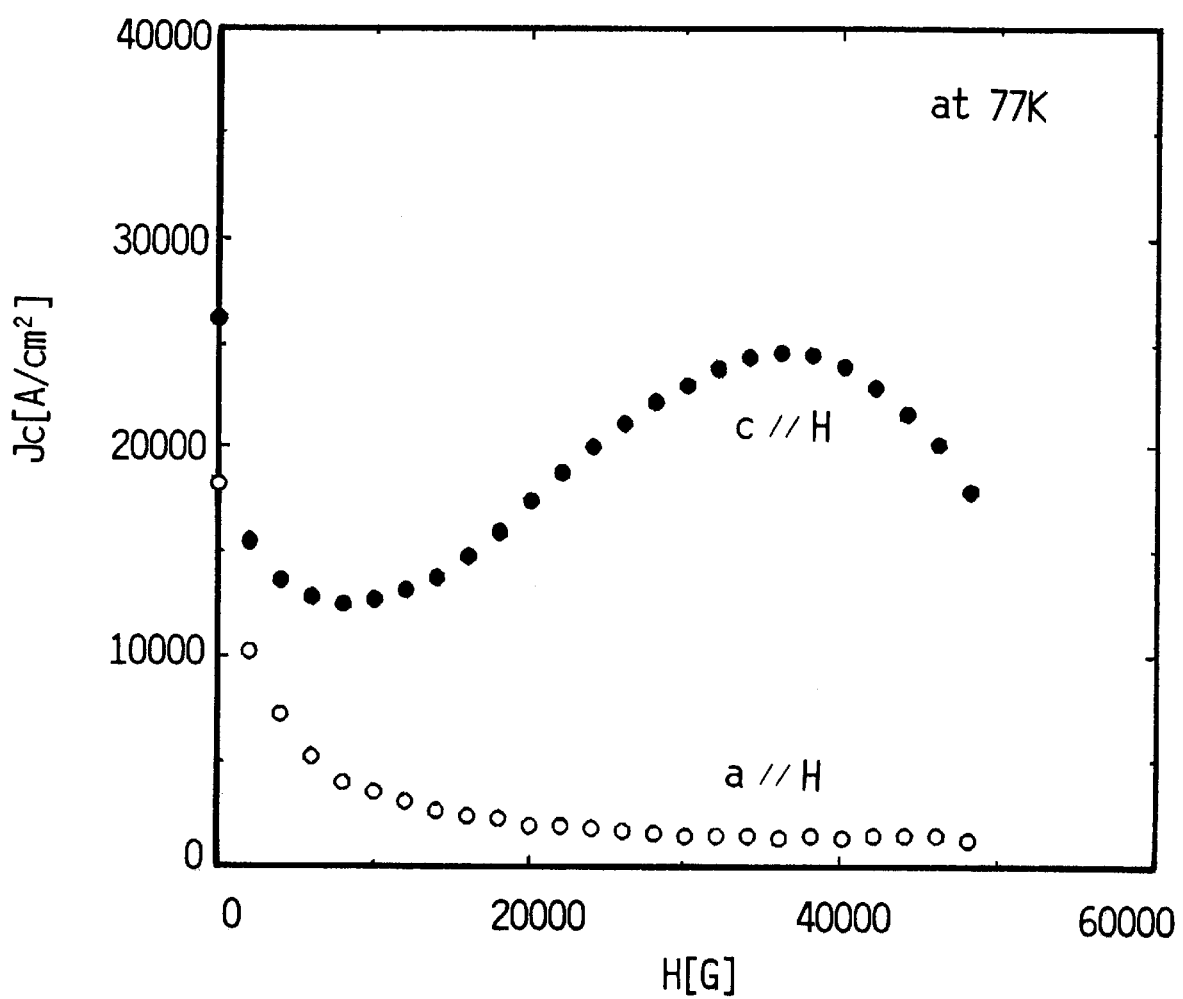
FIG. 8 is a graph showing the critical current density of the superconductor (high Jc superconductor) obtained in Example 4.

FIG. 8 shows the determination of Jc of the sample after the above-mentioned heat treatment. The determination method of Jc and the manner of presentation in a graph were the same as in FIG. 4 relating to Example 2.

As is evident from FIG. 8, the sample obtained in this Example had almost the same Jc properties (FIG. 6) with the high Jc superconductor obtained in Example 3. Consequently, it was confirmed that the high Jc was caused not by an oxygen deficiency, but by a solid reaction which took place in the phase separation temperature range present somewhere between 600° C. and 350° C.

EXAMPLE 5

In this Example, the high Jc superconductor obtained in Example 4 was subjected to a heat treatment at 900° C. which was sufficiently higher than ta, rapidly cooled to room temperature, and subjected to an oxygen introduction in the same manner as in Example 2. That is, the instant Example aimed at confirmation of possible elimination of crystal history which brings back the superconductor into a precursor after once forming a high Jc superconductor.

FIGS. 9(a) and (b) schematically shows the relationship between the temperature and time during the heat treatment applied to the superconductor (sample). This FIG. 9(a) (in the graph, b means being quenched in the air, hereinafter the same) schematically shows the relationship between the temperature and time during the heat treatment applied to the sample. As shown in this graph, the sample was retained at 900° C. which was higher than ta of the sample for 100 hours, and quickly taken out from the furnace and air-quenched.

The heat treatment shown in said FIG. 9(b) was applied to the sample (precursor) after the heat treatment of FIG. 9(a) as mentioned above. The method of the heat treatment was the same as that in Example 2 (graph of FIG. 2).

Figure 10:
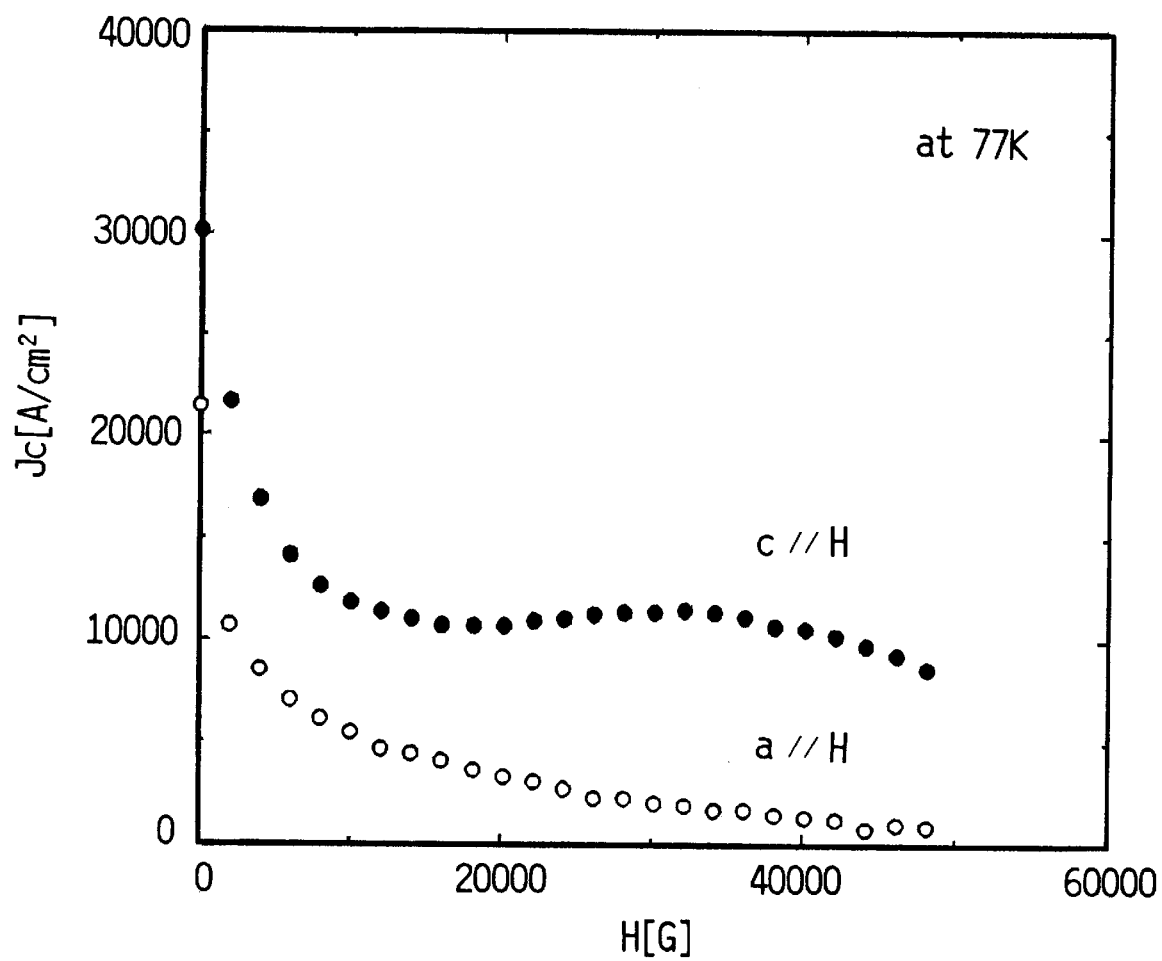
FIG. 10 is a graph showing the critical current density of the superconductor obtained in Example 5.

FIG. 10 shows Jc of the obtained superconductor after the above-mentioned heat treatment. The measurement conditions, the manner of presentation in a graph and the like were the same as those in FIG. 3 relating to Example 2.

As is evident from FIG. 10, the obtained superconductor no longer had a peak in the high magnetic field side, and became a low Jc superconductor as in Example 2. The results reveal that a high Jc superconductor having a peak at a high magnetic field side could be converted to a low Jc superconductor by the heat treatment of the present invention by eliminating the peak at a high magnetic field side to give a precursor and applying this precursor to the treatment of the present invention.

EXAMPLE 6

In this Example, the precursors prepared in Example 1 were retained at three kinds of temperatures of 600° C., 500° C. and 400° C., as shown in FIG. 11(a), FIG. 12(a), and FIG. 13(a), and then rapidly cooled. Then, the precursors were subjected to sufficient oxygen introduction (second heat treatment) [FIG. 11(b), FIG. 12(b), FIG. 13(b)], and the range of phase separation temperature of this sample was generally determined from the properties of the obtained superconductors.

Figure 11:
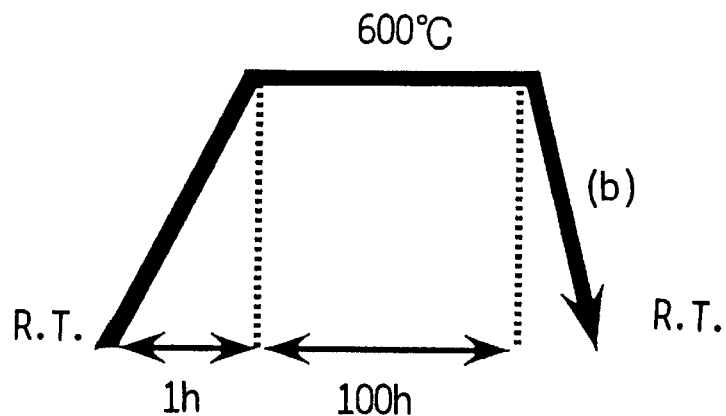
FIGS. 11(a) and 11(b) are graphs schematically showing the relationship between the temperature and time of the heat treatment applied to the precursor in Example 6.
Figure 11:
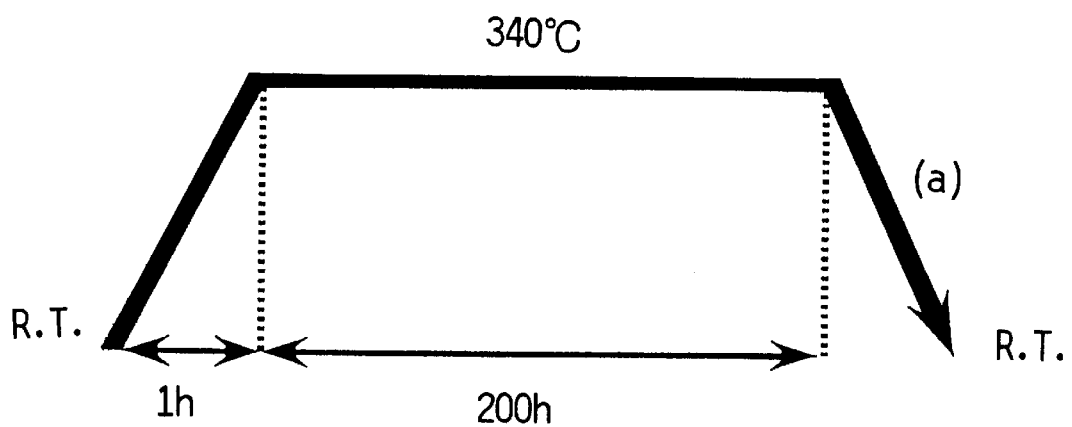
Figure 12:
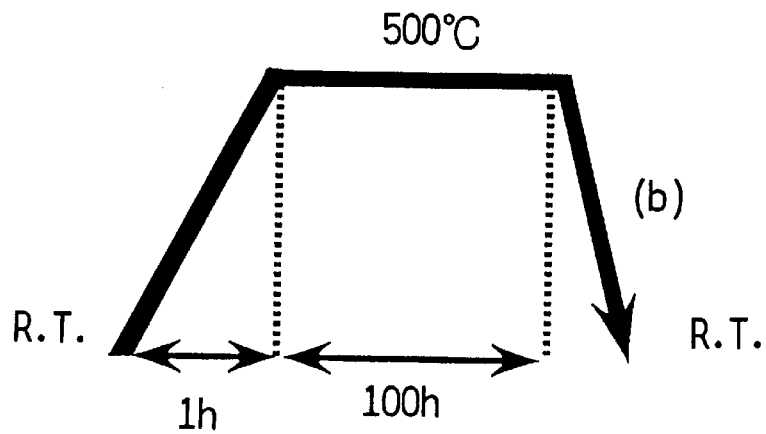
FIGS. 12(a) and 12(b) are graphs schematically showing the relationship between the temperature and time of the heat treatment applied to the precursor in Example 6.
Figure 12:
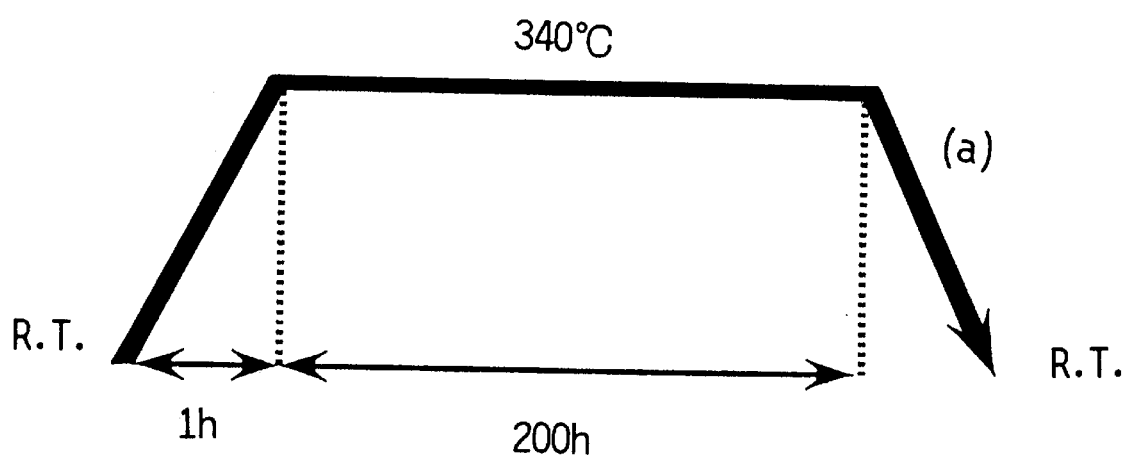
Figure 13:
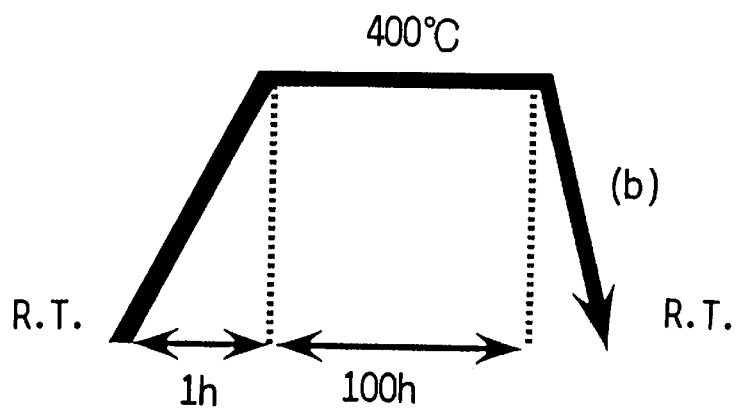
FIGS. 13(a) and 13(b) are graphs schematically showing the relationship between the temperature and time of the heat treatment applied to the precursor in Example 6.
Figure 13:
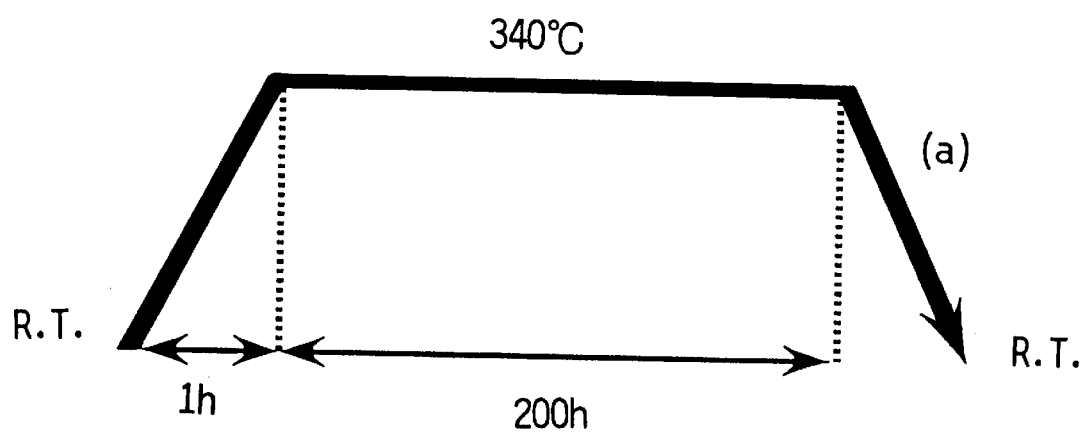
Figure 14:
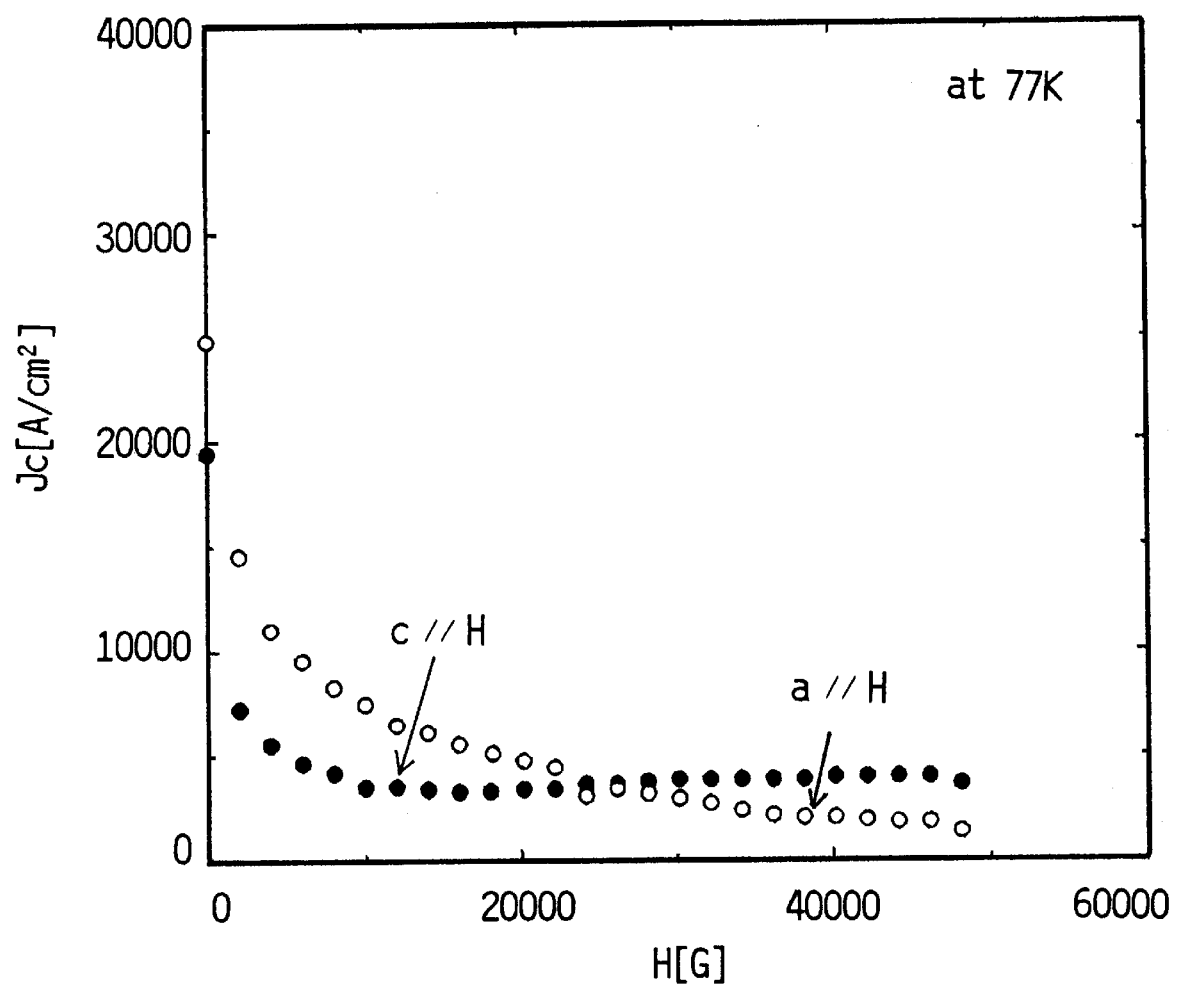
FIG. 14 is a graph showing the critical current density of the superconductor obtained in Example 6 by the heat treatment under the conditions shown in FIG. 11.
Figure 16:
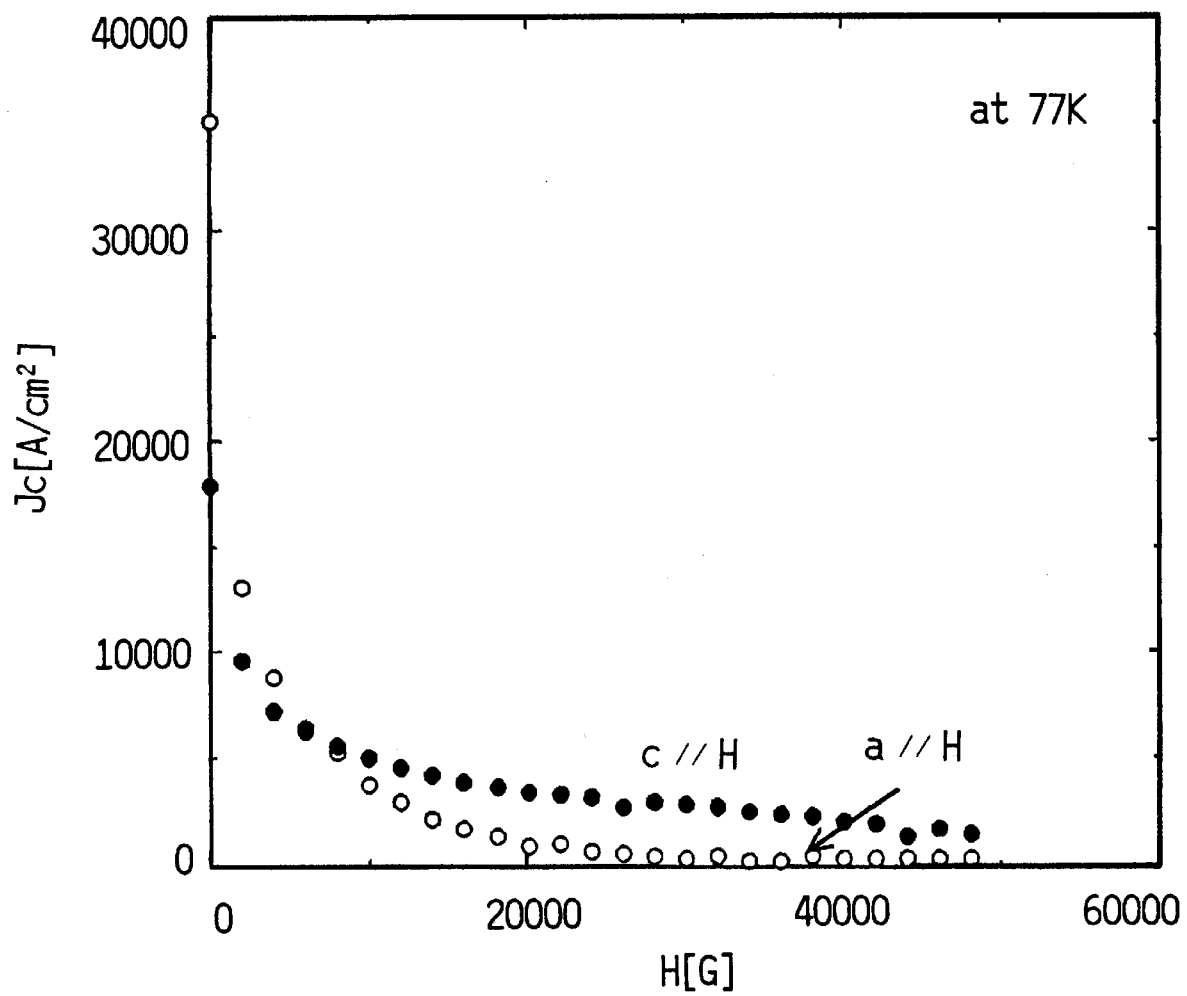
FIG. 16 is a graph showing the critical current density of the superconductor obtained in Example 6 by the heat treatment under the conditions shown in FIG. 13.

The Jc properties shown in FIGS. 14, 15 and 16 respectively correspond to the results of the three kinds of heat treatments shown in FIGS. 11, 12 and 13.

As shown in the graph of FIG. 11(a), when the heat treatment temperature to be applied to the precursor was 600° C., a low Jc superconductor wherein Jc shows monotonous decrease as shown in FIG. 14 was obtained. That is, a phase separation was not found due to the absence of a solid reaction. Thus, the temperature of 600° C. is outside the range of phase separation temperature.

As shown in the graph of FIG. 12(a), moreover, when the heat treatment temperature of the precursor was 500° C., as shown in FIG. 15, Jc showed a peak of 30,000 A/cm² in about 40,000 [G] of the high magnetic field side, whereby indicating that the precursor had turned into a high Jc superconductor. That is, the presence of phase separation as a result of solid reaction was confirmed. Thus, the temperature of 500° C. was within the range of phase separation temperature.

Moreover, as shown in FIG. 13(a), when the heat treatment temperature of the precursor was 400° C., a low Jc superconductor was obtained wherein Jc showed monotonous decrease as shown in FIG. 16. That is, a phase separation was not found due to the absence of a solid reaction. Thus, the temperature of 400° C. was outside the range of phase separation temperature.

These results reveal that the temperature of 600° C. is higher than the phase separation temperature, 500° C. is within the range of phase separation temperature, and 400° C. is lower than the phase separation temperature. Thus, the upper limit ta of the phase separation temperature is between 500° C. and 600° C., and the lower limit tb of the phase separation temperature is between 400° C. and 500° C.

COMPARATIVE EXAMPLE 1

This Comparative Example shows conventional examples of Y123 and Nd123 superconductors prepared by the conventional melting method.

Figure 17:
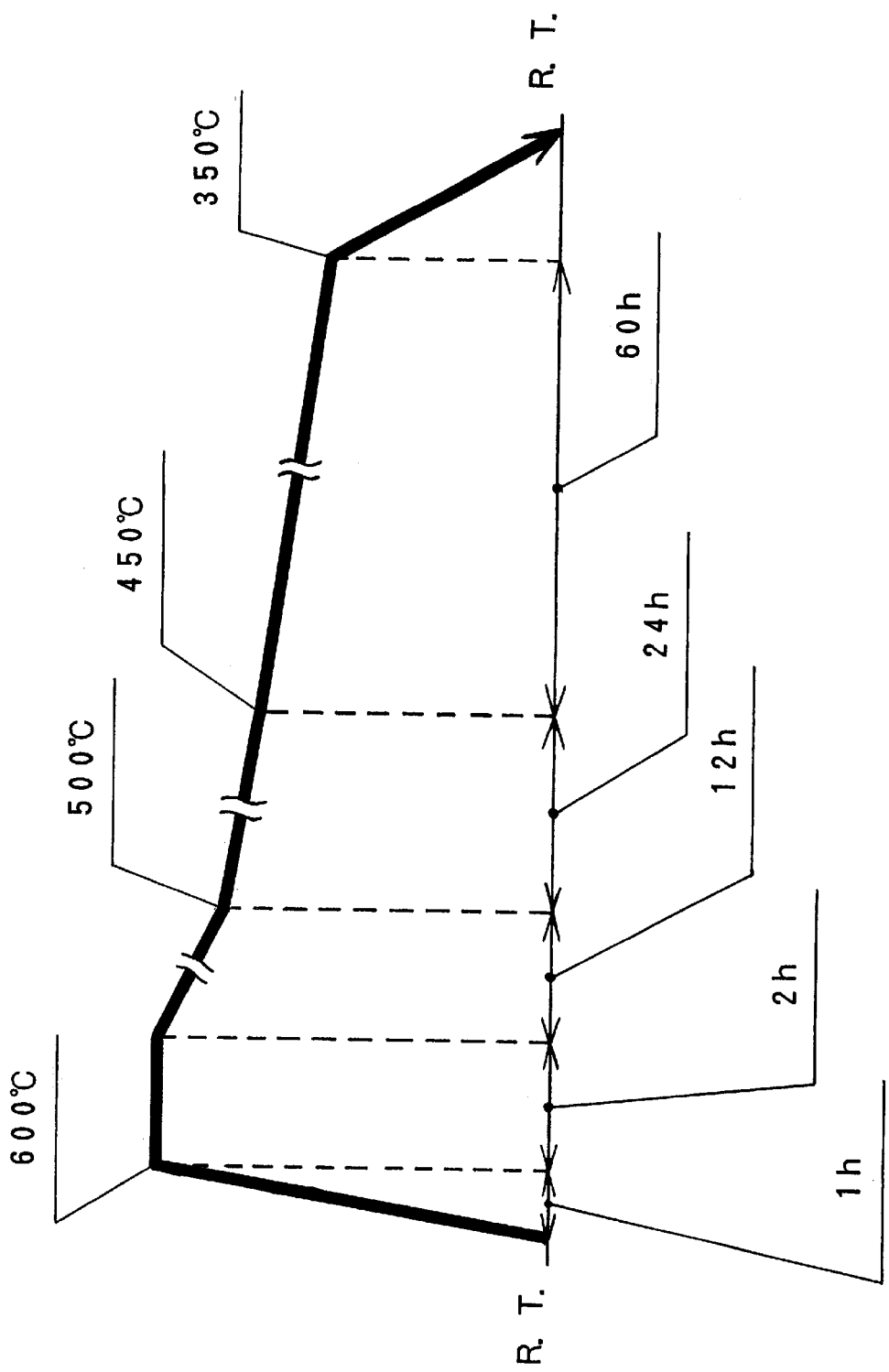
FIG. 17 is a graph schematically showing the relationship between the temperature and time of the heat treatment applied to form an Nd123 superconductor in Comparative Example.

The Nd123 was formed by growing crystals under a low oxygen partial pressure and subjecting the crystals to oxygen introduction under the temperature fall rates shown in FIG. 17. It is clearly known that the temperature was lowered in conventional examples without considering the phase separation in this group of materials or even existence of such phase separation temperature.

Figure 18:
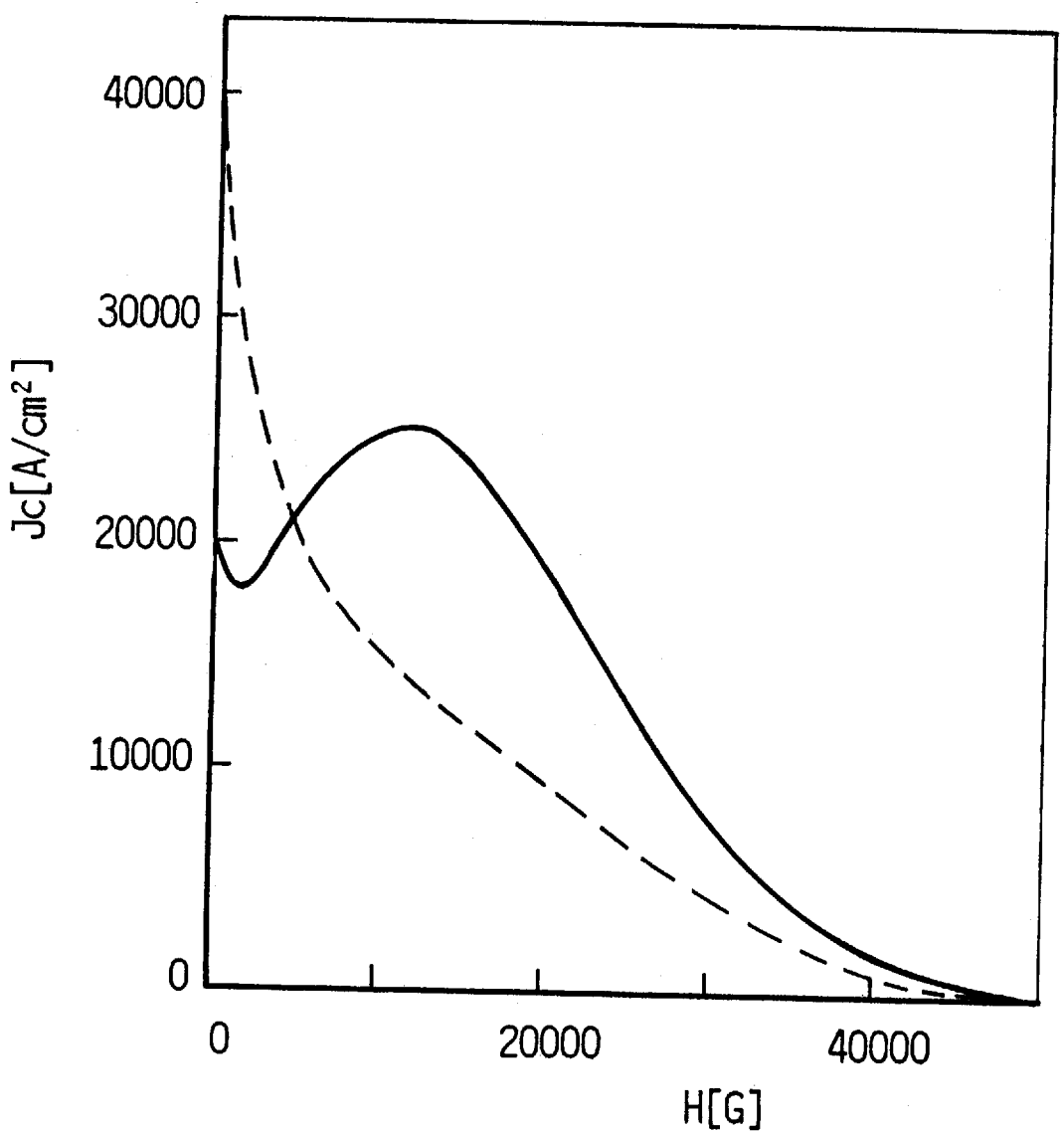
FIG. 18 is a graph showing the critical current density of a Y123 and the Nd123 superconductor obtained in Comparative Example.

FIG. 18 shows determination of Jc properties of the superconductor thus obtained. In FIG. 18, the thick line shows Nd123 and the broken line shows Y123. As is evident from FIG. 18, the Jc property of the Y123 superconductor prepared by the conventional method was that of a monotonous decrease, and that of the Nd123 superconductor was a peak in about 12000 [G], and they are noticeably different from a high Jc superconductor of the present invention.

As mentioned above, a fine structure can be controlled in the present invention by merely changing the heat treatment conditions, and a superconductor having a high Jc, or having different properties with respect to Jc, which has not been obtained heretofore with the same material composition can be obtained according to the present invention.

By using the superconductor of the present invention, superior magnets such as superconductive coil having high Tc and high Jc can be obtained. In addition, an element which cannot be obtained from Nd123 and the like can be also prepared.

What is claimed is:

1. A superconductive crystal having an overall composition of the formula $R_{1+x}Ba_{2-x}Cu_3O_{7-y1}$ wherein R is a rare earth, $0 \leq x \leq 1$ and $-1 \leq y1 < 1$, wherein at least 40% of the superconductive crystal comprises a mixture of distinct phases of formulas A and B:

wherein y1 is defined as above, $0 \leq z \leq 1$, $0 \leq w \leq 1$ provided $z \neq w$, and wherein said crystal has a critical current density not less than 10,000 A/cm² at 77K and 0T.

2. The superconductive crystal of claim 1, wherein R is a rare earth element selected from the group consisting of La, Ce, Pr, Nd, Pm, Sm, Eu and Gd.

3. The superconductive crystal of claim 1, which is a mixture of a compound of the formula (II'):

$$R'_{1+x}Ba_{2-x}Cu_3O_{7-y1} \quad (II')$$

wherein R' is La, Ce, Pr, Nd, Pm, Sm, Eu or Gd, and x and y1 are as defined in claim 1, and a compound of the formula (II"):

$$R''_{1+x}Ba_{2-x}Cu_3O_{7-y1} \quad (II'')$$

wherein R" is a rare earth element selected from lanthanoid and Y, and x and y1 are as defined in claim 1.

4. The superconductive crystal of claim 1, which is obtained by heating a precursor comprising a solid solution of the formula (I):

$$R_{1+x}Ba_{2-x}Cu_3O_{7-y} \quad (I)$$

wherein R is a rare earth element, $0 \leq x \leq 1$ and $-1 \leq y \leq 1$, in which more than 10% of a crystal of the solid solution comprises said mixture of distinct phases, to form a phase separation in the crystal at a phase separation temperature (°C.) of the precursor, and introducing oxygen.

5. A method for preparing a superconductive crystal having an overall composition of the formula $R_{1+x}Ba_{2-x}Cu_3O_{7-y1}$ wherein R is a rare earth, $0 \leq x \leq 1$ and $-1 \leq y1 < 1$, wherein at least 40% of the superconductive crystal comprises a mixture of distinct phases of formulas A and B:

$$R_{1+x}Ba_{2-x}Cu_3O_{7-y1} \quad A)$$

$$R_{1+x}Ba_{2-x}Cu_3O_{7-y1} \quad B)$$

wherein y1 is defined as above, $0 \leq z \leq 1$, $0 \leq w \leq 1$ provided $z \neq w$, and wherein said crystal has a critical current density not less than 10,000 A/cm² at 77K and 0T, which method comprises heating a precursor comprising a solid solution of the formula (I):

$$R_{1+x}Ba_{2-x}Cu_3O_{7-y} \quad (I)$$

wherein R is a rare earth element, $0 \leq x \leq 1$ and $-1 < y \leq 1$, in which not more than 10% of a crystal of the solid solution comprises said mixture of distinct phases, to form a phase separation in the crystal at a phase separation temperature (°C.) of the precursor, and introducing oxygen.

6. The superconductive crystal of claim 1, comprising a compound of the formula (II):

$$R_{1+x}Ba_{2-x}Cu_3O_{7-y1} \quad (II)$$

wherein R is a rare earth element, $0 \leq x \leq 1$ and $-1 \leq y1 < 1$, in which not more than 10% of a crystal of the superconductor shows phase separation, and in a magnetic field of not less than 1T at a constant temperature of 77K, a critical current density is less than 10,000 A/cm².

7. The superconductive crystal of claim 6, wherein R in formula (II) is a rare earth element selected from the group consisting of La, Ce, Pr, Nd, Pm, Sm, Eu and Gd.

8. The superconductive crystal of claim 6, which comprises a mixture of a compound of the formula (II'):

$$R'_{1+x}Ba_{2-x}Cu_3O_{7-y1} \quad (II')$$

wherein R' is La, Ce, Pr, Nd, Pm, Sm, Eu or Gd, and x and y1 are as defined in claim 6, and a compound of the formula (II"):

$$R''_{1+x}Ba_{2-x}Cu_3O_{7-y1} \quad (II'')$$

wherein R" is a rare earth element selected from lanthanoid and Y, and x and y1 are as defined in claim 6.

9. The superconductive crystal of claim 6, which is obtained by introducing oxygen into a precursor comprising a solid solution of the formula (I):

$$R_{1+x}Ba_{2-x}Cu_3O_{7-y} \quad (I)$$

wherein R is a rare earth element, $0 \leq x \leq 1$ and $-1 < y \leq 1$, in which not more than 10% of a crystal of the solid solution comprises said mixture of distinct phases, at a temperature less than the lower limit of the phase separation temperature of said precursor.

10. A method for preparing a superconductive crystal of claim 1, comprising a compound of the formula (II):

$$R_{1+x}Ba_{2-x}Cu_3O_{7-y1} \quad (II)$$

wherein R is a rare earth element, $0 \leq x \leq 1$ and $-1 \leq y1 < 1$, in which not more than 10% of a crystal of the superconductor shows phase separation, and in a magnetic field of not less than 1T at a constant temperature of 77K, a critical current density is less than 10,000 A/cm², which method comprises introducing oxygen into a precursor of the formula (I):

$$R_{1+x}Ba_{2-x}Cu_3O_{7-y} \quad (I)$$

wherein R is a rare earth element, $0 \leq x \leq 1$ and $-1 < y \leq 1$, in which not more than 10% of a crystal of the solid solution comprises said mixture of distinct phases, at a temperature less than the lower limit of the phase separation temperature of the precursor.

11. A magnet comprising a conductor comprising a superconductive crystal having an overall composition of the formula $R_{1+x}Ba_{2-x}Cu_3O_{7-y1}$ wherein R is a rare earth, $0 \leq x \leq 1$ and $-1 \leq y1 < 1$, wherein at least 40% of the superconductive crystal comprises a mixture of distinct phases of formulas A and B:

$$R_{1+x}Ba_{2-x}Cu_3O_{7-y1} \quad A)$$

$$R_{1+x}Ba_{2-x}Cu_3O_{7-y1} \quad B)$$

wherein y1 is defined as above, $0 \leq z \leq 1$, $0 \leq w \leq 1$ provided $z \neq w$, and wherein said crystal has a critical current density not less than 10,000 A/cm² at 77K and 0T.

12. A superconductive element or electronic part comprising a conductor comprising a superconductive crystal of claim 1, comprising a compound of the formula (II):

$$R_{1+x}Ba_{2-x}Cu_3O_{7-y1} \quad (II)$$

wherein R is a rare earth element, $0 \leq x \leq 1$ and $-1 \leq y1 < 1$, in which not more than 10% of a crystal of the superconductor shows phase separation, and in a magnetic field of not less than 1T at a constant temperature of 77K, a critical current density is less than 10,000 A/cm².

* * * * *